(12) United States Patent
Lee et al.

(10) Patent No.: US 8,050,023 B2
(45) Date of Patent: Nov. 1, 2011

(54) FRAME WITH A MOUNTING EAR, DISPLAY DEVICE USING THE FRAME AND A METHOD OF MANUFACTURING THE SAME

(75) Inventors: Ping Lee, Hsin-Chu (TW); Wen-Mao Wen, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 198 days.

(21) Appl. No.: 12/269,195

(22) Filed: Nov. 12, 2008

(65) Prior Publication Data
US 2009/0122473 A1 May 14, 2009

(30) Foreign Application Priority Data
Nov. 14, 2007 (TW) ............................... 96143005 A

(51) Int. Cl.
*G06F 1/16* (2006.01)
*G02F 1/1333* (2006.01)
*G09G 5/00* (2006.01)
*H04M 1/00* (2006.01)

(52) U.S. Cl. ..................... 361/679.24; 349/58; 345/156; 455/575.1

(58) Field of Classification Search ............ 361/679.01–679.45, 679.55–679.59; 345/156, 157, 168, 345/169; 455/575.1, 575.3, 575.4; 349/58–60
See application file for complete search history.

(56) References Cited

U.S. PATENT DOCUMENTS

| | | | |
|---|---|---|---|
| 5,570,267 A * | 10/1996 | Ma ......................... | 361/679.21 |
| 6,507,377 B1 * | 1/2003 | Jung ............................. | 349/60 |
| 6,507,484 B2 * | 1/2003 | Fukuyoshi ............... | 361/679.26 |
| 6,919,937 B2 * | 7/2005 | Kim et al. ...................... | 349/58 |
| 6,930,734 B2 * | 8/2005 | Lee ................................ | 349/58 |
| 6,975,368 B2 * | 12/2005 | Lee ................................ | 349/58 |
| 7,274,560 B2 * | 9/2007 | Jeong et al. ............ | 361/679.27 |
| 2007/0008687 A1 | 1/2007 | Fukuda | |

FOREIGN PATENT DOCUMENTS

| | | |
|---|---|---|
| CN | 1467543 A | 1/2004 |
| CN | 1504802 A | 6/2004 |
| CN | 1984546 | 6/2007 |

OTHER PUBLICATIONS

Chinese language office action dated Jan. 23, 2009.
English language translation of abstract and pertinent parts of CN 1984546.
Taiwan Office Action dated Mar. 2, 2011.

\* cited by examiner

*Primary Examiner* — Jayprakash N Gandhi
*Assistant Examiner* — Nidhi Desai
(74) *Attorney, Agent, or Firm* — Thomas, Kayden, Horstemeyer & Risley, LLP

(57) ABSTRACT

A frame with a mounting ear, a display device using the frame and a method of manufacture thereof are provided. The frame includes a frame body and a mounting ear. The frame body has a top frame and a sidewall extending from an edge of the frame top frame. A tap hole is formed on the frame body, and the ear passes through the tap hole to connect with an inner surface of the sidewall. Besides the frame, the display device further includes a display panel module. The display panel module is disposed inside the frame and outwardly displays images via a transparent area enclosed by the frame.

18 Claims, 16 Drawing Sheets

FRAME WITH A MOUNTING EAR, DISPLAY DEVICE USING THE FRAME AND A METHOD OF MANUFACTURING THE SAME

BACKGROUND OF THE INVENTION

1. Field of the Invention

This invention relates to a frame having a mounting ear, a display device using the frame and a manufacturing method thereof.

2. Description of the Prior Art

Display panels including liquid crystal display panels and organic light emitting diode display panels, as well as the panel display devices using the display panels have become the mainstream of all kinds of display devices. For example, all kinds of panel display boards, home flat television, the flat panel monitors of personal computer and laptop computers, and the display screens of mobile phones and digital cameras are all the products which largely use display panels.

Conventionally, when the display panels are connected to the housings of flat monitors, laptop computers, mobile phones or other products, it is necessary to dispose tap holes in the front frame to be secured. As illustrated by FIG. 1a, in the conventional design, the top of the front frame 30 of the display panel 10 is disposed with the connecting pieces 50 having tap holes 51. The connecting pieces 50 are secured to the front frame 30 to support the weight of the display panel 10. By disposing the connecting piece 50, screws should go through the tap holes 51 during assembly, in order to secure the display panel 10 to the system housing 70. However, in such design, because the connecting pieces 50 are disposed on the outside of the front frame 30 as an add-on, the part where the connecting piece 50 and front frame 30 are connected will cause unevenness on the outer side of the front frame. The system housing 70 needs to be adjusted during manufacturing process in order to accommodate the connection between the connecting piece 50 and the front frame 30.

FIG. 1b illustrates another design of the conventional display device. In this design, the connecting pieces 50 are formed by partly stamping the front frame 30 of the display panel 10; in other words, part of the front frame 30 is cut and bent upwards to form the connecting piece 50. The connecting piece 50 is disposed with tap holes 51, which are used to secure the display panel 10 to the system housing 70. Although this design does not have the problem of unevenness on the outer side of the front frame 30, the strength of the front frame 30 is influenced. The connecting piece 50 is formed by cutting part of the front frame 30 and bending the cut part of the front frame 30 upwards, thus there will be a discontinuous part on the front frame 30. This discontinuous part will decrease the overall mechanical strength and rigidity.

SUMMARY OF THE INVENTION

An object of this invention is to provide a frame for an electronic device, a display device using this frame and a manufacturing method thereof, in which the assembled products have smaller overall volume.

An object of this invention is to provide an electronic device frame, a display device using the frame and a manufacturing method thereof, in which the frame has a certain amount of mechanical strength and rigidity.

The electronic device frame of this invention mainly includes the frame body and the mounting ears. The frame body includes top surfaces and sidewalls, wherein the top surfaces are parallel and enclose a transparent area, and the sidewalls extend away from the top surfaces from the edges of the top surfaces, respectively. The frame body is provided with tap holes, and the mounting ears are respectively extended into the tap holes from outside the frame body along the extending direction of the sidewall. Outside the frame body refers to the space outside the space surrounded by the frame body. The part of the mounting ear extended into the tap hole is connected to the inner surface of the sidewall, so as to support the weight of the frame body itself and the force received. By disposing the mounting ears, the frame body and the electronic device covered by the frame body can be secured to the system housing. For example, the frame body and the liquid crystal display panel covered by the frame body can be secured to the housings of mobile phones, car guiding devices, liquid crystal televisions, flat monitors, lap top computers or the housings of other systems.

The display device of this invention, apart from the frame of the electronic device, further includes a display panel module. The display panel module is disposed in the frame body, and displays image through the transparent area surrounded by the frame body. On the side of the display panel module has a trough. The trough corresponds to the part which accommodates the mounting ear, the part extended through the tap holes, so as to prevent the difficulty in assembling the mounting ear and the display panel module without increasing the size of the frame body. Such design can also position the corresponding positions of the display panel module and the frame body.

The manufacturing method of the display device includes the following steps: forming tap holes in the frame body, extending a part of the mounting ear from the outside of the frame into the tap hole along an extending direction of a sidewall of the frame body, connecting the part where the mounting ear entering the tap holes and the inner surface of the sidewalls, and disposing the display panel in the frame body.

DETAILED DESCRIPTION OF THE PREFERRED EMBODIMENT

This invention provides a frame of an electronic device having mounting ears, connecting plate or other connecting devices for fixation, so as to secure the electronic device itself in the system. This invention also includes a display device using the electronic device frame and a manufacturing method thereof. In a preferred embodiment, the display device of this invention includes a liquid crystal display device. The liquid display device described herein refers to any display devices that use liquid crystal panels, including household liquid crystal display television, the liquid crystal monitors of personal computer and laptop computer, and the liquid crystal screens of mobile phones and digital cameras.

Figure 1A:
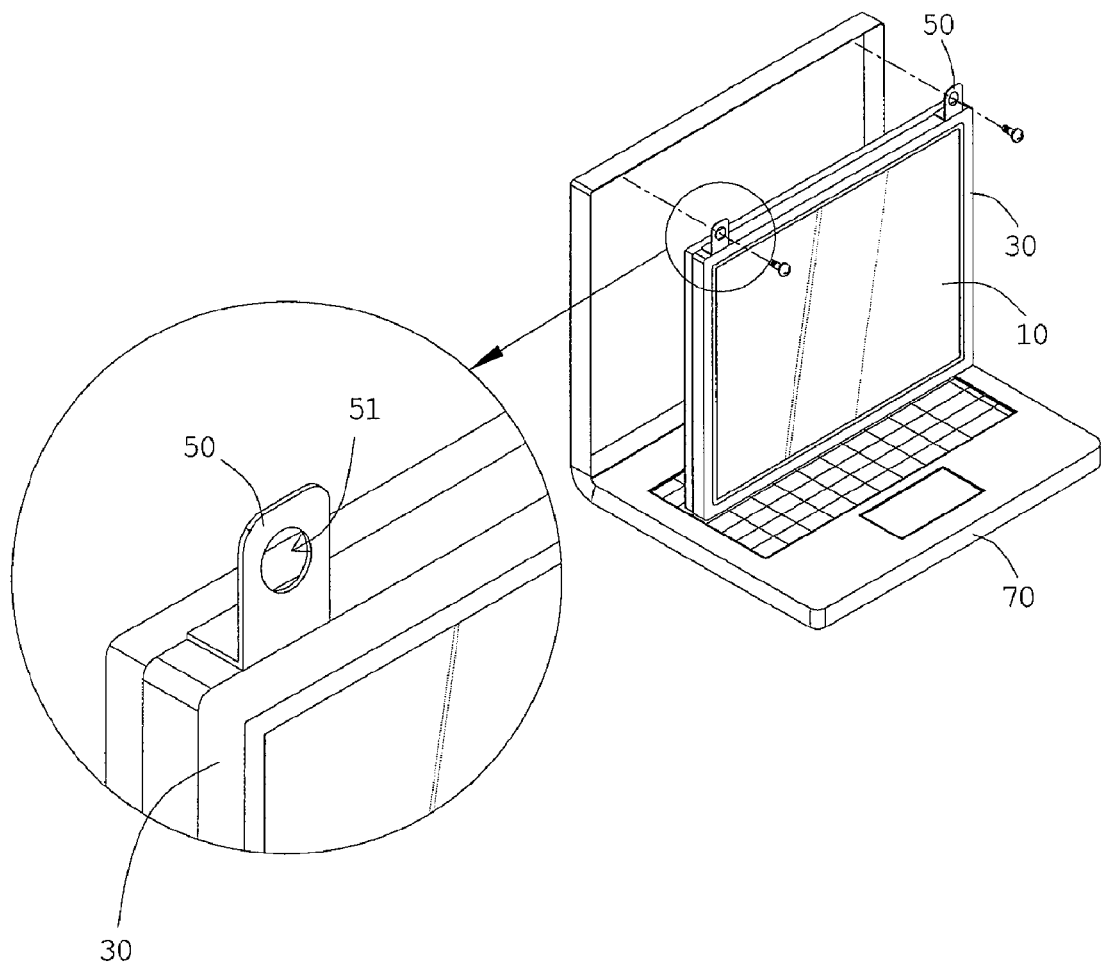
FIG. 1a and FIG. 1b schematically illustrate the frame of the conventional display device.
Figure 1B:
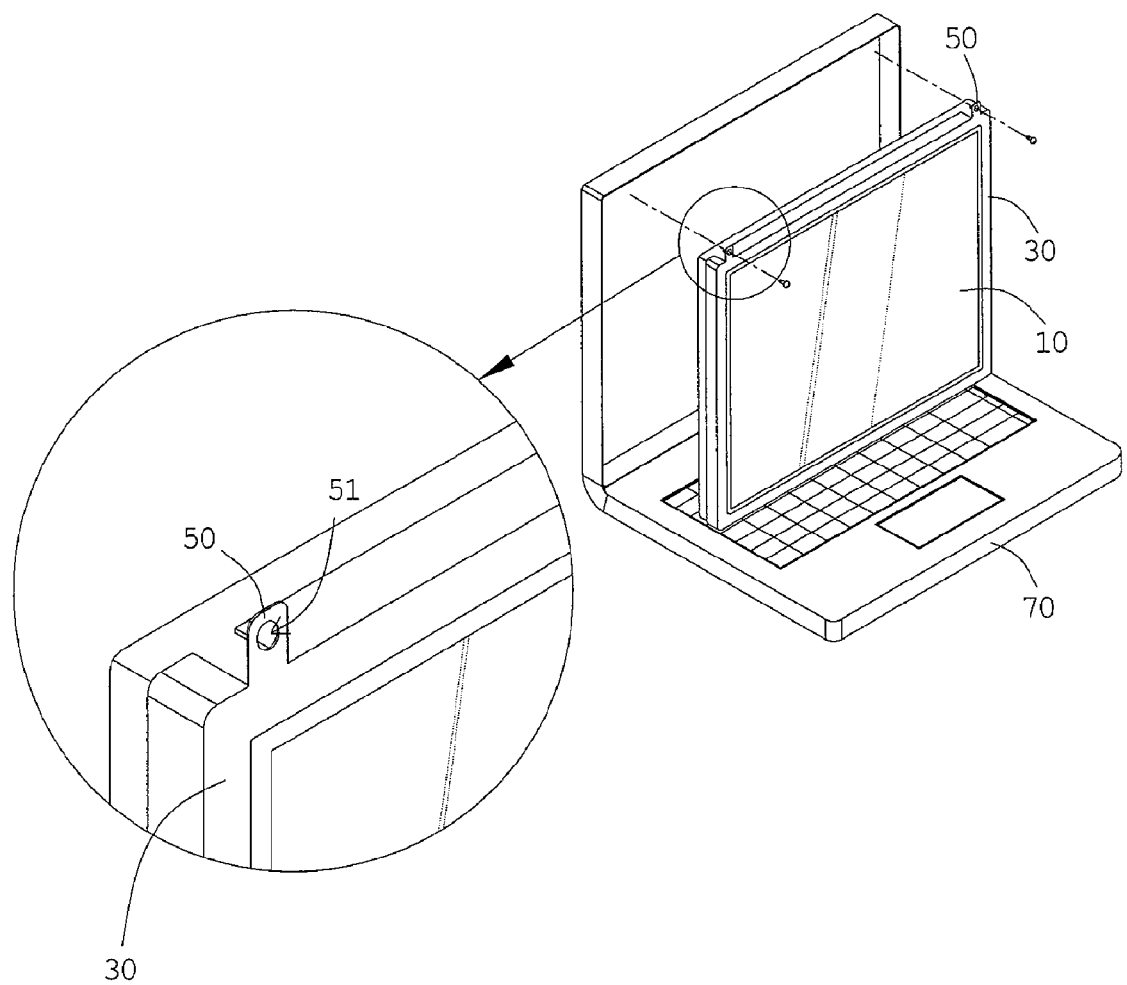
Figure 2:
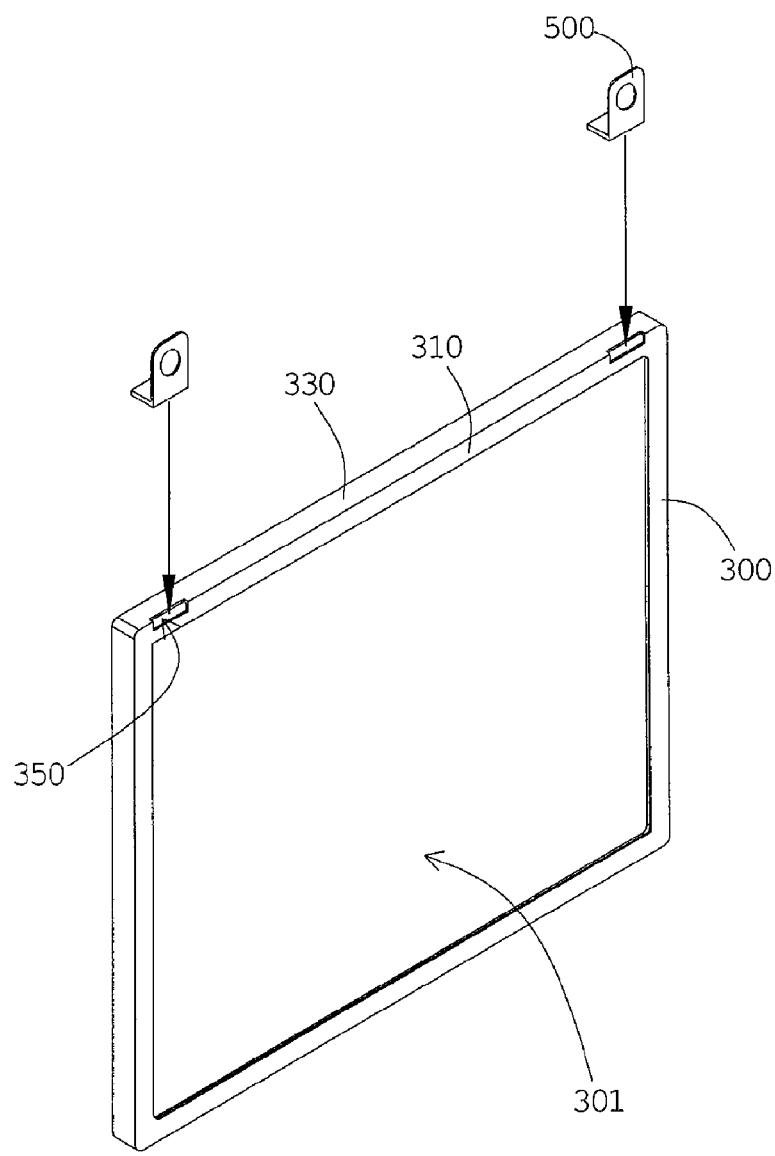
FIG. 2 is the exploded view of the embodiment of the frame of the electronic device of this invention.

As illustrated in FIG. 2, the frame of the electronic device includes a frame body 300 and a mounting ear 500. In this embodiment, the frame body 300 is a rectangular frame, and a rectangular transparent area 301 is formed therein; however, in another embodiment, the frame body 300 can also be other kinds of polygons, circular shapes, or other shapes of frames. Moreover, the shape of the frame 300 and the shape of the transparent area surrounded therein do not have to be the same. The frame body 300 and the mounting ear 500 are preferably made of metal, such as stainless steel, aluminum or other metal or alloy; however, the frame body 300 can also be made of plasticity or other materials.

In the embodiment illustrated in FIG. 2, the frame body 300 has a top surface 310 and a sidewall 330. The frame body 300 of the embodiment is a rectangular frame with four sides, each side consisting of a top surface 310 and a sidewall 330. The top surfaces 310 are parallel and form a transparent area 301, and the sidewalls 330 extend in the direction away from the top surface 310 from the edges of the top surfaces 310, respectively. As illustrated in FIG. 2, the sidewall 330 is perpendicular to the top surface 310; however, in other embodiments, the included angle between the sidewall 330 and the top surface 310 can also be an angle other than right angle.

Figure 3:
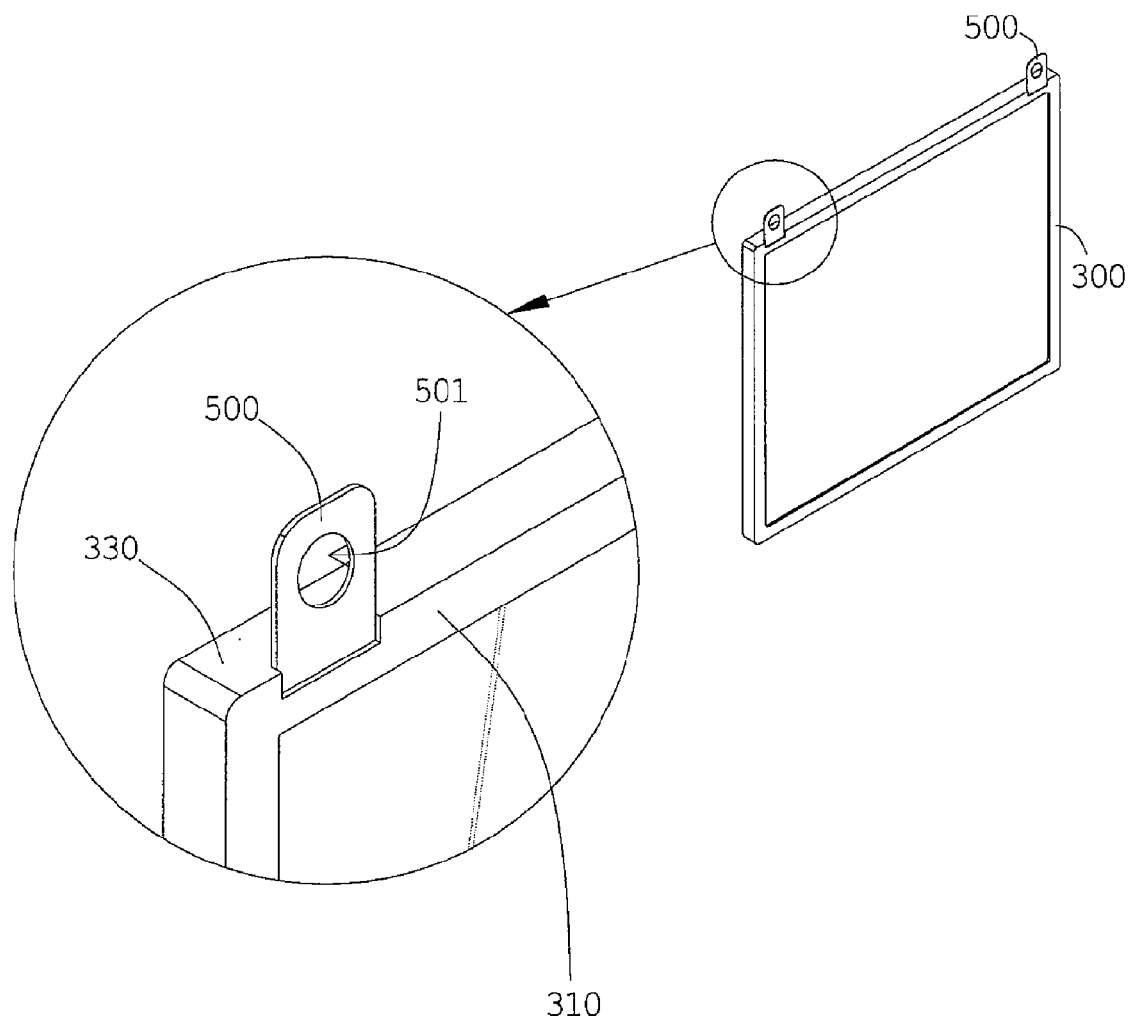
FIG. 3 is the schematic illustration of the embodiment shown by FIG. 2☐

In addition, the frame body 300 is tapped with tap hole 350. As illustrated by FIG. 2, the tapped hole 350 is preferably a narrow and long opening and parallel to the sides of the frame body 300. As illustrated by FIG. 3, a part of the mounting ear 500 extends into the tap hole 350 from the outside of the frame 300 along the extending direction of the sidewall 330. The so-called outside of the frame 300 refers to the space outside the area surrounded by the frame body 300; in this embodiment, the spaces outside the area surrounded by the sidewalls 330 of the four sides are all the outside of the frame body 300. In the embodiment, the mounting ear 500 is preferably an L-shaped connection piece including a body and a bent part. The bent part of the mounting ear 500 that extends into the tap holes 350 is connected to the inner surface of the sidewall 330. The connecting method preferably includes welding, such as spot welding; however, the mounting ear 500 and the inner surface of the sidewall 330 can also be connected through adhering or other ways.

Figure 4A:
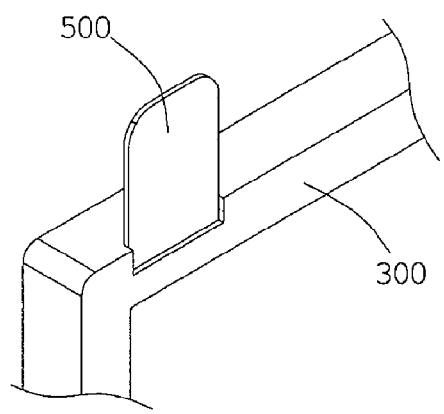
FIG. 4a schematically illustrates another embodiment of the mounting ear.

As illustrated by FIG. 3, the body of the mounting ear 500 that is exposed to the outside of the frame body 300 has a securing hole 501. By disposing the securing hole 501, the frame body 300 and the electronic device covered by the frame body 300 (not shown) are connected to the system housing screw or other connecting device with similar function. For example, the frame body 300 and the liquid crystal display panel covered by the frame body 300 can be secured to mobile phone, car guiding device, liquid crystal television, flat monitor, laptop computer or the housing of other systems by, for example, putting screws through securing holes 501. However, in the embodiment illustrated by FIG. 4a, the mounting ear 500 can also not be disposed with securing holes 501, and it can simply be a connecting plate. The connecting plate formed by the mounting ear 500 can go through the hole formed in the system housing (not shown) to fix or secure the corresponding positions of the frame body 300 and the system housing.

Figure 4B:
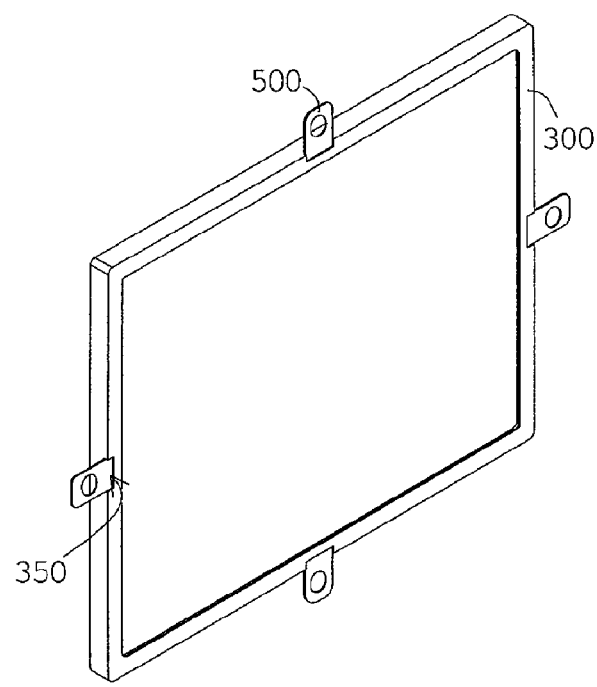
FIG. 4b is the schematic illustration of another embodiment of the electronic device.

In the embodiment illustrated by FIG. 3, the tap hole 350 and the mounting ear 500 are disposed on one end of one side of the frame body 300 close to another side of the frame body 300; however, in the embodiment illustrated by FIG. 4b, the tap hole 350 and the mounting ear 500 can be disposed in the middle or any places on the side of the frame body 300. Moreover, in the embodiment illustrated by FIG. 3, the tap hole 350 and the mounting ear 500 are only disposed on one side of the frame body 300; however, in the embodiment illustrated by FIG. 4b, the tap hole 350 and the mounting ear 500 may also be disposed on a plurality of sides of the frame body 300.

Figure 5A:
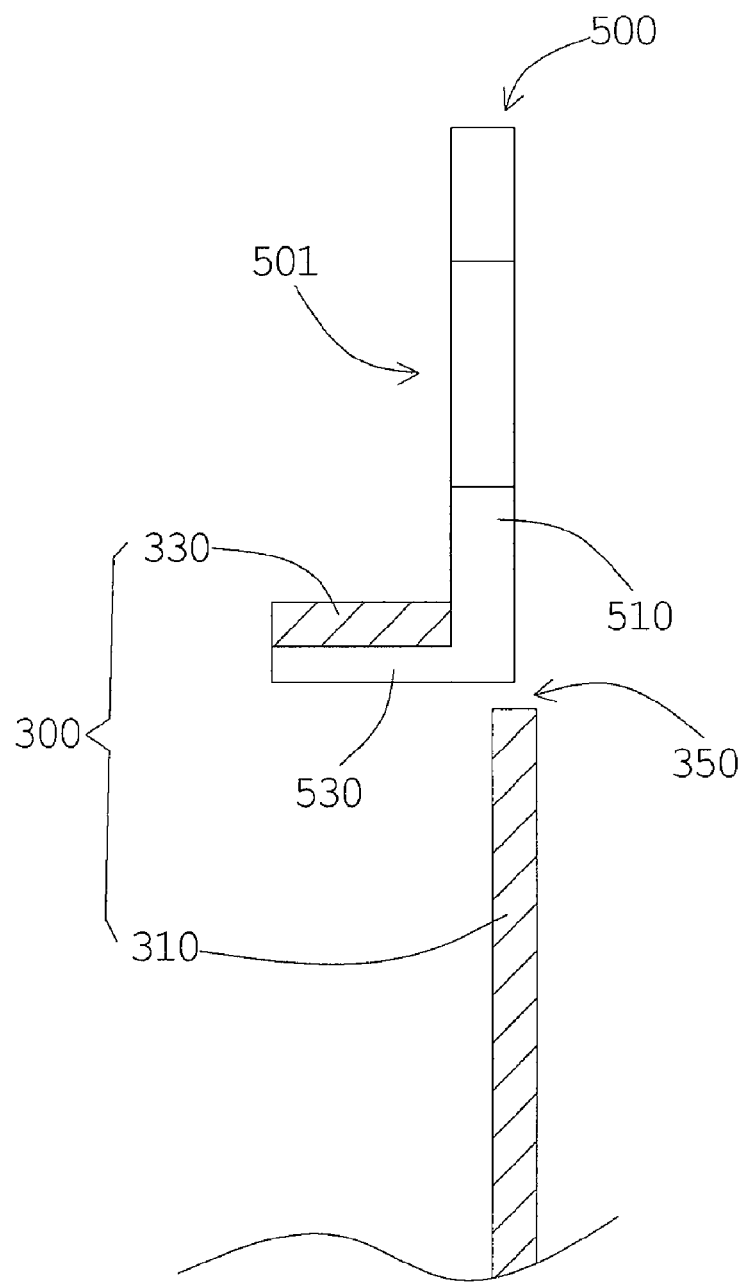
FIG. 5a is the cross-sectional view of the embodiment of the frame of the electronic device.
Figure 5B:
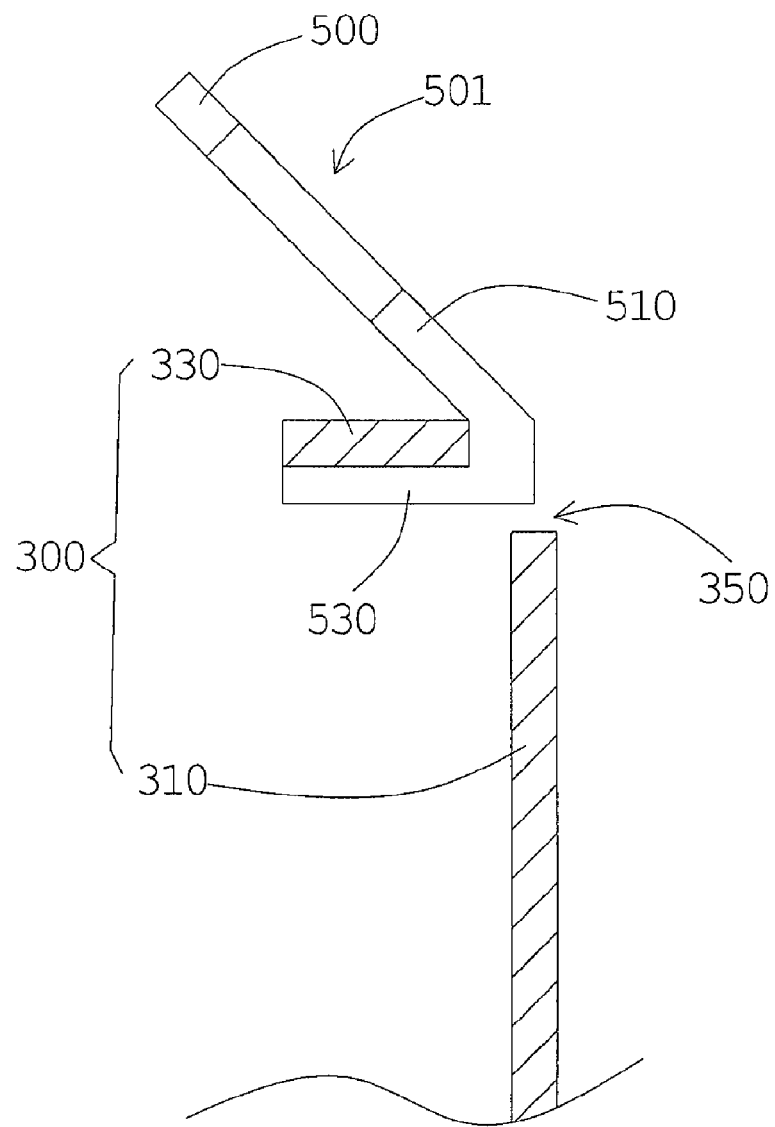
FIG. 5b is the cross-sectional view of another embodiment of the frame of the electronic device.
Figure 5C:
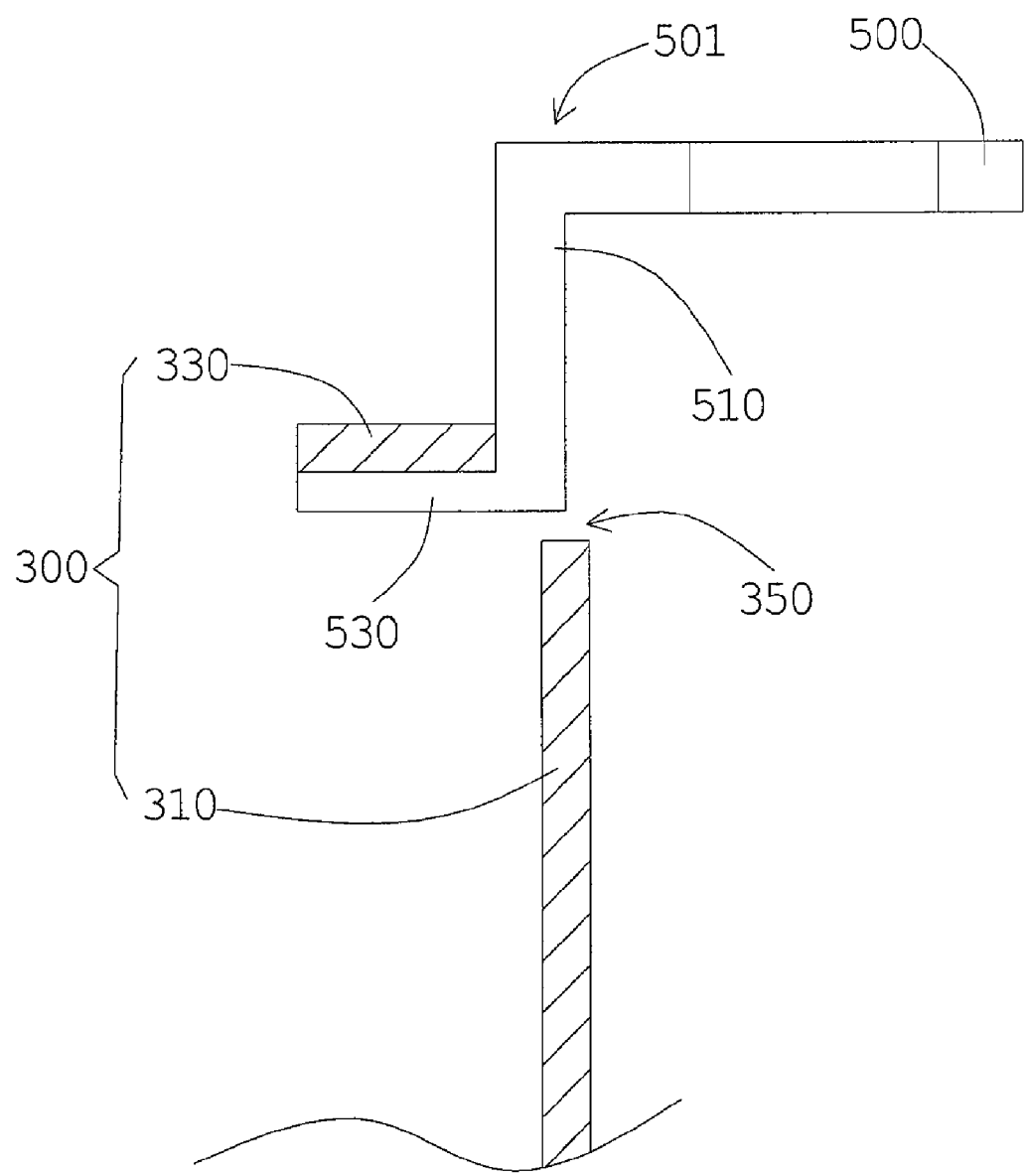
FIG. 5c is the cross-sectional view of another embodiment of the frame of the electronic device.
Figure 5D:
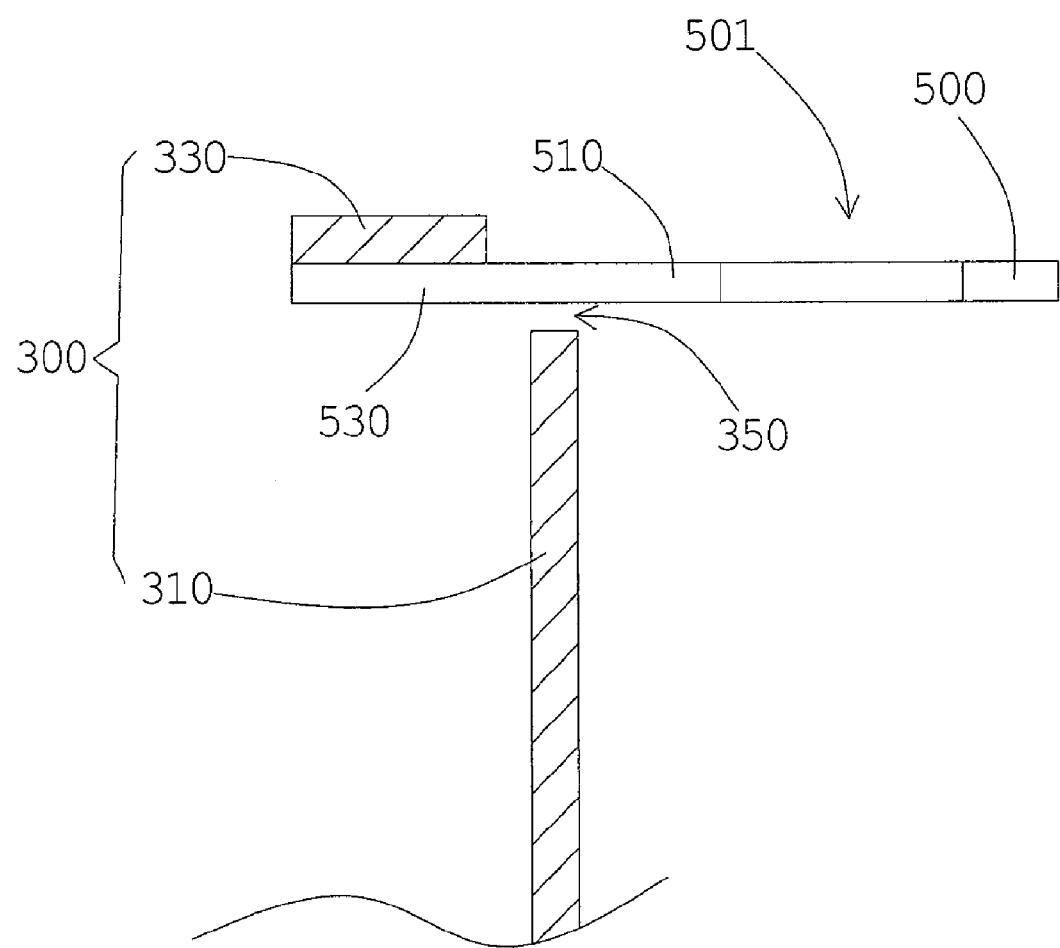
FIG. 5d is the cross-sectional view of another embodiment of the frame of the electronic device.

In the embodiment illustrated by FIG. 5a, the mounting ear 500 includes the body 510 and the bent part 530. The securing hole 501 is formed in the body 510, and the bent part 530 extends from the body 510, and is perpendicular to the body 510 or with a different included angle. As illustrated by FIG. 5b, the included angle between the body 510 and the bent part 530 can be adjusted in accordance with the included angle between the top surface 310 and the sidewall 330 of the frame body 300, and can also be adjusted in accordance with the securing design of the system housing. As illustrated by FIG. 5a, the body 510 of the mounting ear 500 is remained outside of the frame body 300, and the bent part 530 extends into the tap hole 350 in the frame body 300 along the extending direction of the sidewall 330 and is connected to the inner surface of the sidewall 330. Moreover, as illustrated by FIG. 5c, the body 510 of the mounting ear 500 that is left outside the frame body 300 can also have different bending or angle, so as to coordinate with the design of the system housing. With such design, the body 510 of the mounting ear 500 can support the weight of the frame body 300 itself or the force from outside by connecting the bent part 530 and the frame body 300. As illustrated by FIG. 5d, the mounting ear 500 is a plane plate that is to say the body 510 of the mounting ear 500 and the bent part 530 are disposed on the same horizontal plane. The body 510 is parallel to the sidewall 330 and located on the outside of the frame body 300. The bent part 530 extends into the tap hole 350 and is connected to the inner surface of the sidewall 330 of the frame body 300. With such design, the frame body 300 and the mounting ear 500 are able to be secured to the system housing with different design.

As illustrated by FIG. 5a, in order to save the space taken by the frame body 300, the bent part 530 of the mounting ear 500 that extends into the tap hole 350 is fully covered by the sidewall 330. In other words, the bent part 530 of the mounting ear 500 that extends into the tap hole 350 will not extend out from the other end of the sidewall 330. In this embodiment, the length of the bent part 530 of the mounting ear 500 needs to be shorter or equal to the length of the sidewall 330, to ensure that the bent part 530 will not stick out from the other end of the sidewall 330. Furthermore, when the mounting ear 500 and the frame body 300 are connected using spot welding, the length of the part of the mounting ear 500 that extends into tap hole 350 is not shorter than 1 mm to ensure the strength of welding.

Figure 6:
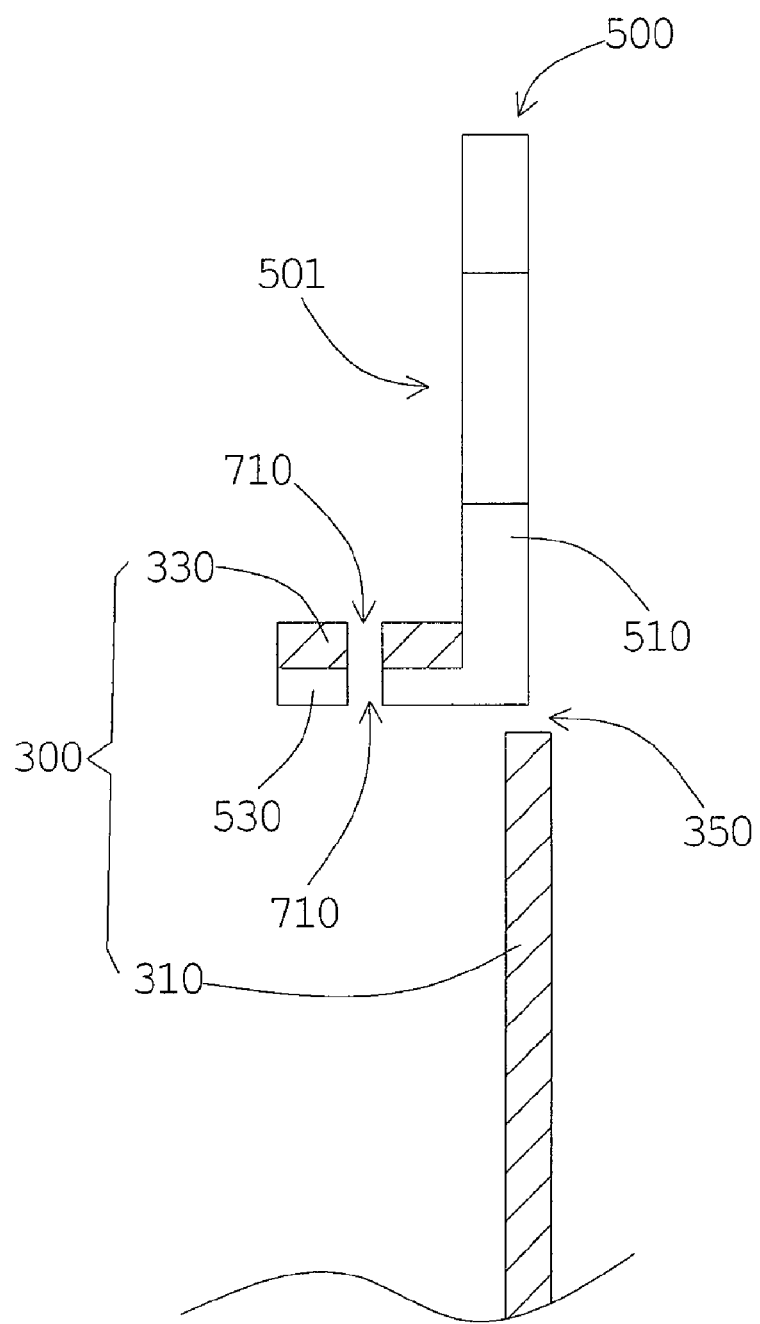
FIG. 6 is the cross-sectional view of the embodiment of the positioning point.

As illustrated by FIG. 6, the bent part of the mounting ear 500 that extends into the tap hole 350 and the sidewall 330 of the frame body 300 can be provided with corresponding positioning points, respectively. In this embodiment, the sidewall 330 and the bent part 530 of the mounting ear 500 that extends into the tap hole 350 are disposed with positioning hole 710 to be the positioning point. When connected, the sidewall 330 and the mounting ear 500 can be aligned by putting positioning needle through the positioning holes 710 on the kit. By disposing the positioning point, the corresponding positions of the mounting ear 500 and the sidewall 330 of the frame body 300 can be secured before the mounting ear 500 and the frame body 300 being connected, so as to prevent deviation in the corresponding positions thereof after being connected. Moreover, the number and the shape of the positioning hole 710 can be adjusted in accordance with the size of the mounting ear 500 and the thickness of the sidewall 330. If more than two positioning holes 710 are disposed or non-symmetric geometric shape positioning holes 710 are disposed (not shown), the mounting ear 500 can be further prevented from rotating relative to the sidewall 330. In this embodiment, in order to successfully position the positioning point 710, the length of the part of the mounting ear 500 that extends into the tap holes 350 is not shorter than 2 mm.

Figure 7A:
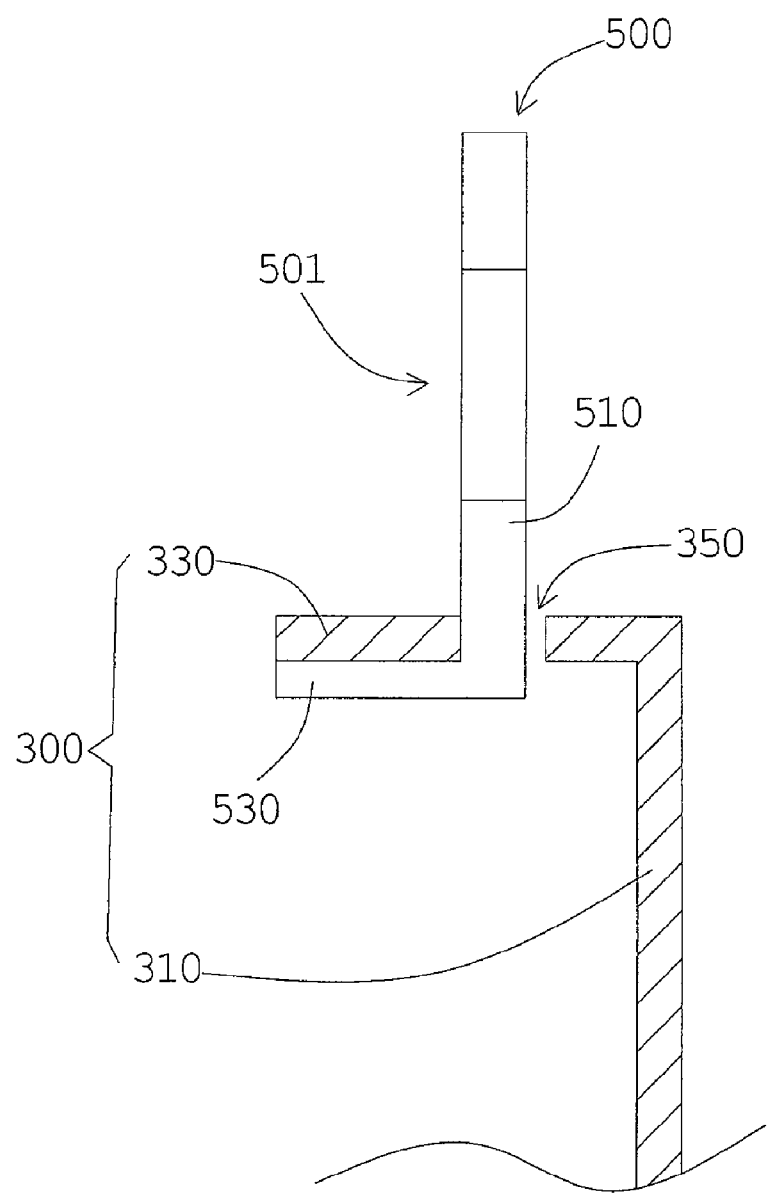
FIG. 7a is the cross-sectional view of another embodiment of the tap hole position.
Figure 7B:
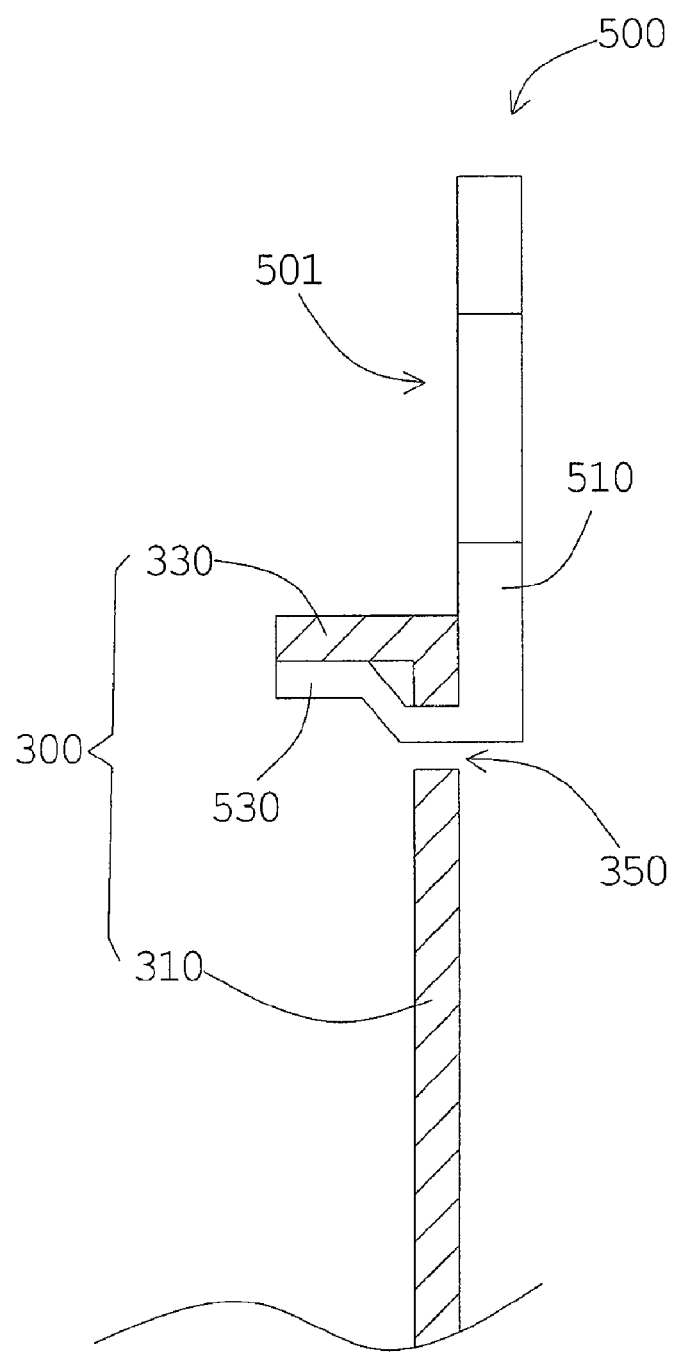
FIG. 7b is the cross-sectional view of another embodiment of the tap hole position.

In the embodiment of FIG. 5a and FIG. 6, the tap holes 350 are all formed at the junction of the top surface 310 and the sidewall 330 of the frame body 300. Meanwhile, the body 510 of the mounting ear 500 left outside of the frame body 300 is closer to the top surface 310. However, in the embodiment illustrated by FIG. 7a, the position of the tap hole 350 can also be disposed at the sidewall 330 near the top surface 310. Meanwhile, the body 510 of the mounting ear 500 left outside of the frame body 300 is retreated from the top surface 310 of the frame body 300. In the embodiment of FIG. 7b, the position of the tap hole 350 is disposed at the top surface 310 near the sidewall 330. Meanwhile, the body 510 of the mounting ear 500 left outside of the frame body 300 sticks out further than the top surface 310 of the frame body 300. Moreover, in order to coordinate with the position of the tap hole 350, the bent part 530 of the mounting ear 500 that extends into the tap hole 350 needs to add a bending portion to connect to the inner surface of the sidewall 330.

Figure 8A:
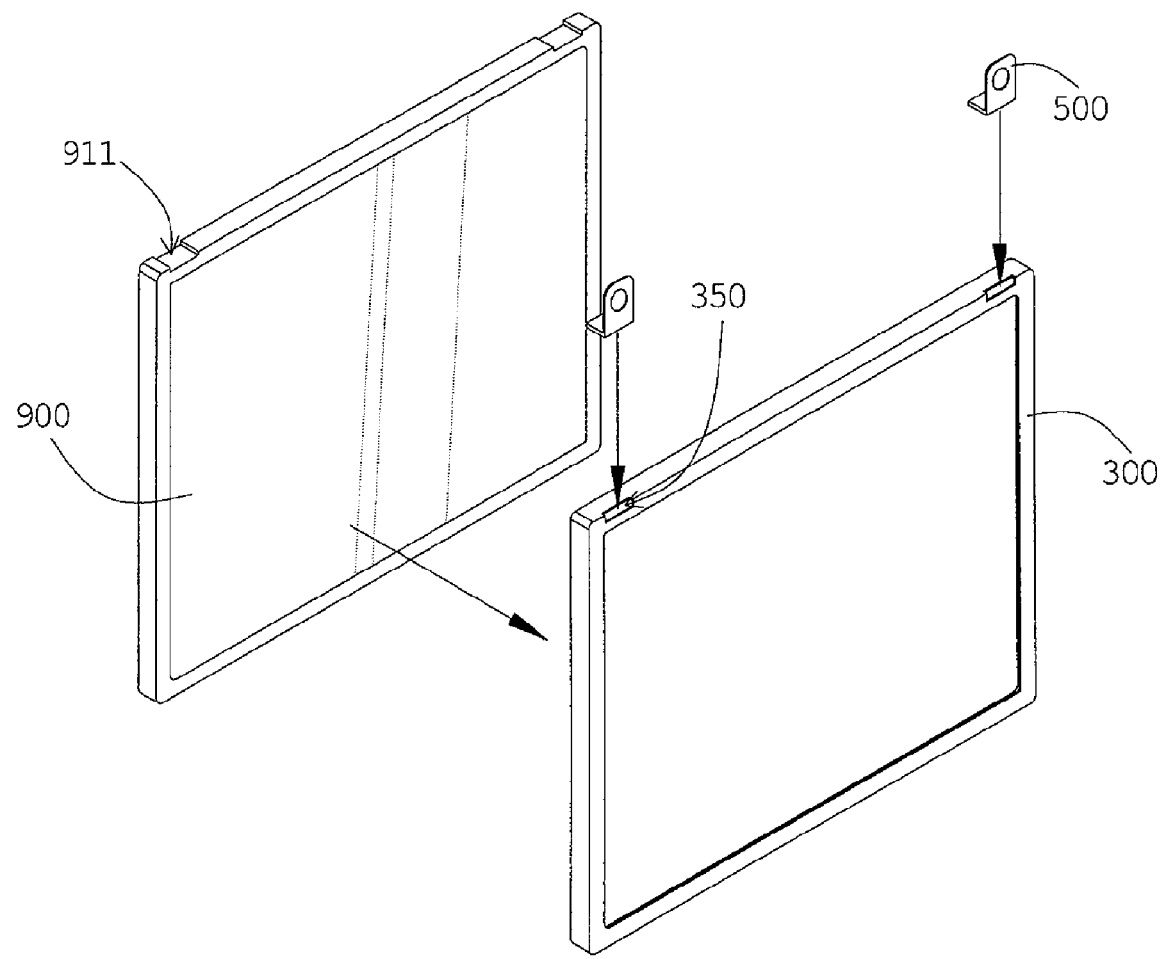
FIG. 8a is the exploded view of the embodiment of the display device.
Figure 8B:
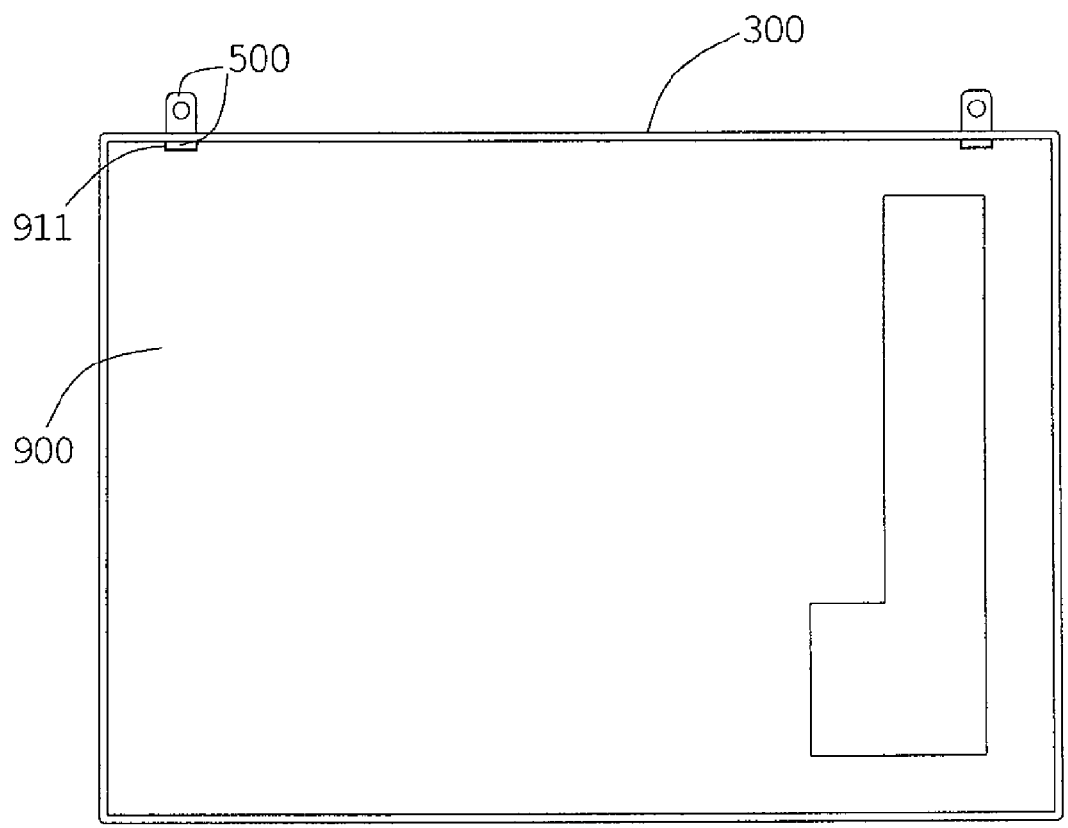
FIG. 8b is the back view of the display device.

FIG. 8a schematically illustrates the display device of this invention. In this embodiment, the display panel module 900 is disposed in the frame body 300, and display the image through the transparent area surrounded by the frame body 300. The display panel module 900 preferably includes a liquid crystal display panel; however, in different embodiments, the display panel module 900 can also includes plasma display panel or other display panel. As illustrated by FIG. 8a and FIG. 8b, a trough 911 is formed on the side of the display panel module 900. The trough 911 corresponds to the bent part of the mounting ear 500 that extends into the tap hole 350 to reduce the difficulty in the assembling of the mounting ear 500 and the display panel module 900 without increasing the size of the frame body 300. Such a design can further position the corresponding positions of the display panel module 900 and the frame body 300. The display panel module 900 preferably has a rubber frame or the bottom frame of the backlight module, and the trough 911 is formed on the rubber frame of the bottom frame.

Figure 9:
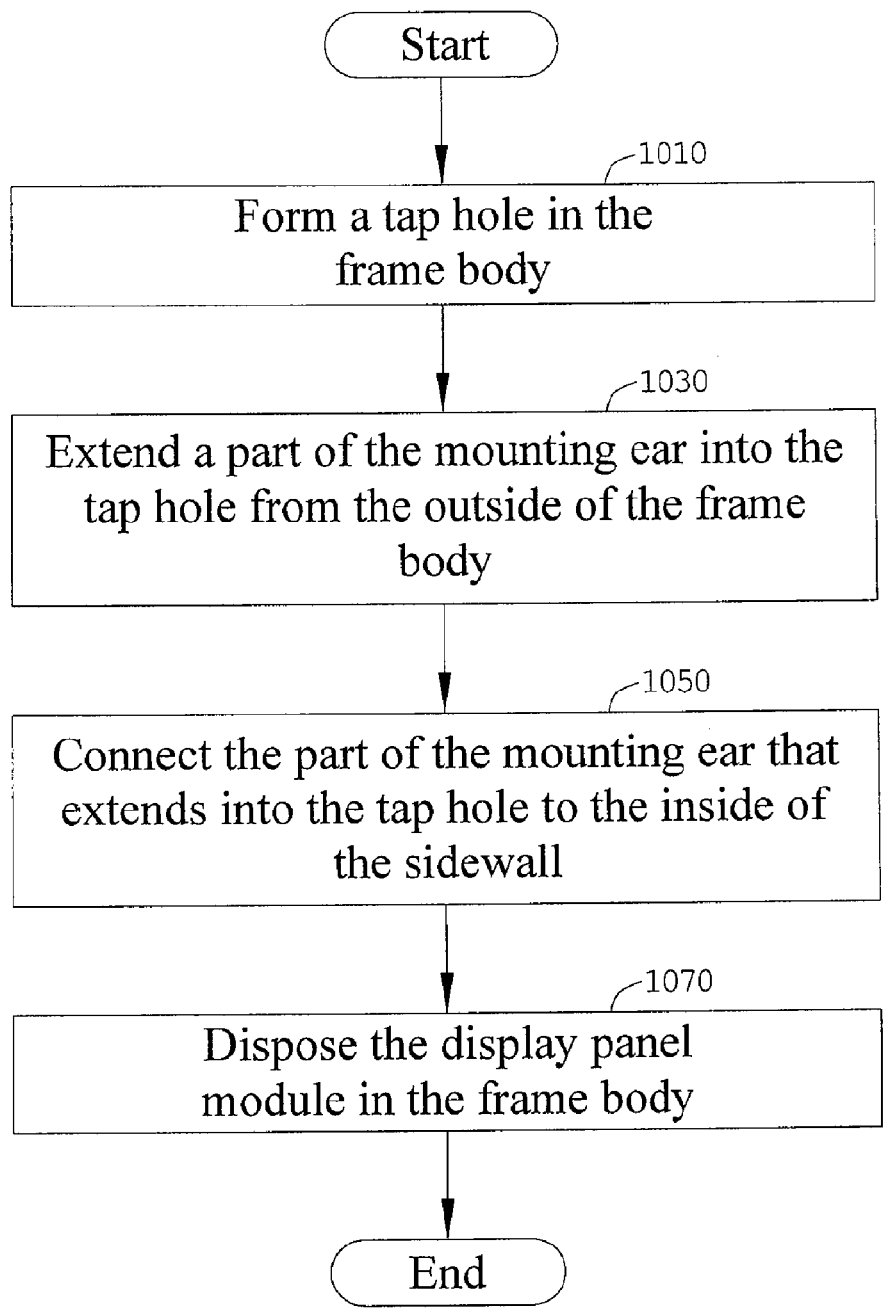
FIG. 9 is the flow chart of the embodiment of the manufacturing method of the display device.

In the flow chart of the embodiment illustrated by FIG. 9, the manufacturing method of the display device includes step 1010 of forming a tap hole in the frame body. When the frame is made of metal material, the tap hole is preferably formed in the frame by means of tapping. The position of the tap hole can be formed at one end of one side of the frame body near another side of the frame body, at the middle part of the side or any other places. The number of the tapped holes can also be increased or decreased in accordance with the need of the design.

Step 1030 includes extending a part of the mounting ear into the tap hole from the outside of the frame body along an extending direction of a sidewall of the frame body. Moreover, securing hole can be formed in the other part of the mounting ear that is positioned on the outside of the frame body. The securing hole is preferably formed in the mounting ear before the mounting ear extending into the tap hole; however, the securing hole can also be formed in the mounting ear after extending the mounting ear into the tap hole.

Step 1050 includes connecting the part of the mounting ear that extends into the tap hole and the inner surface of the sidewall. The connecting methods preferably include welding, such as spot welding; however, the mounting ear 500 and the inner surface of the sidewalls 330 can also be connected by adhering or other ways. Moreover, this step could also include forming corresponding positioning points on the part of the mounting ear that extends into the tap hole and the sidewall, respectively, and aligning the positioning point of the mounting ear with the positioning point of the sidewall. In the preferred embodiment, the positioning holes may be disposed on the sidewalls and on the part of the mounting ear that extends into the tap hole, respectively, to be the positioning points. When connecting, the positioning pin on the kit may be put through the two positioning holes that are kept aligned, so as to position the sidewall and the mounting ear. By disposing and aligning the positioning points, the deviation in the corresponding positions of the mounting ear and the frame body after being connected may be prevented. Furthermore, the number and the shape of the positioning holes may be adjusted in accordance with the size and the thickness of the sidewall; if more than two positioning holes or asymmetric shape are disposed, the mounting ear can be further prevented from rotating relative to the sidewall.

Step 1070 includes disposing a display panel module in the frame body. In order to reduce the size of the frame body and the difficulty in assembling, a trough can be formed on the side of the display panel module, and the trough corresponds and accommodates the part of the mounting ear that extends into the tap hole. The display panel module preferably has a rubber frame or the bottom frame of the backlight module, and a trough is formed on the rubber frame or the bottom frame.

Figure 10:
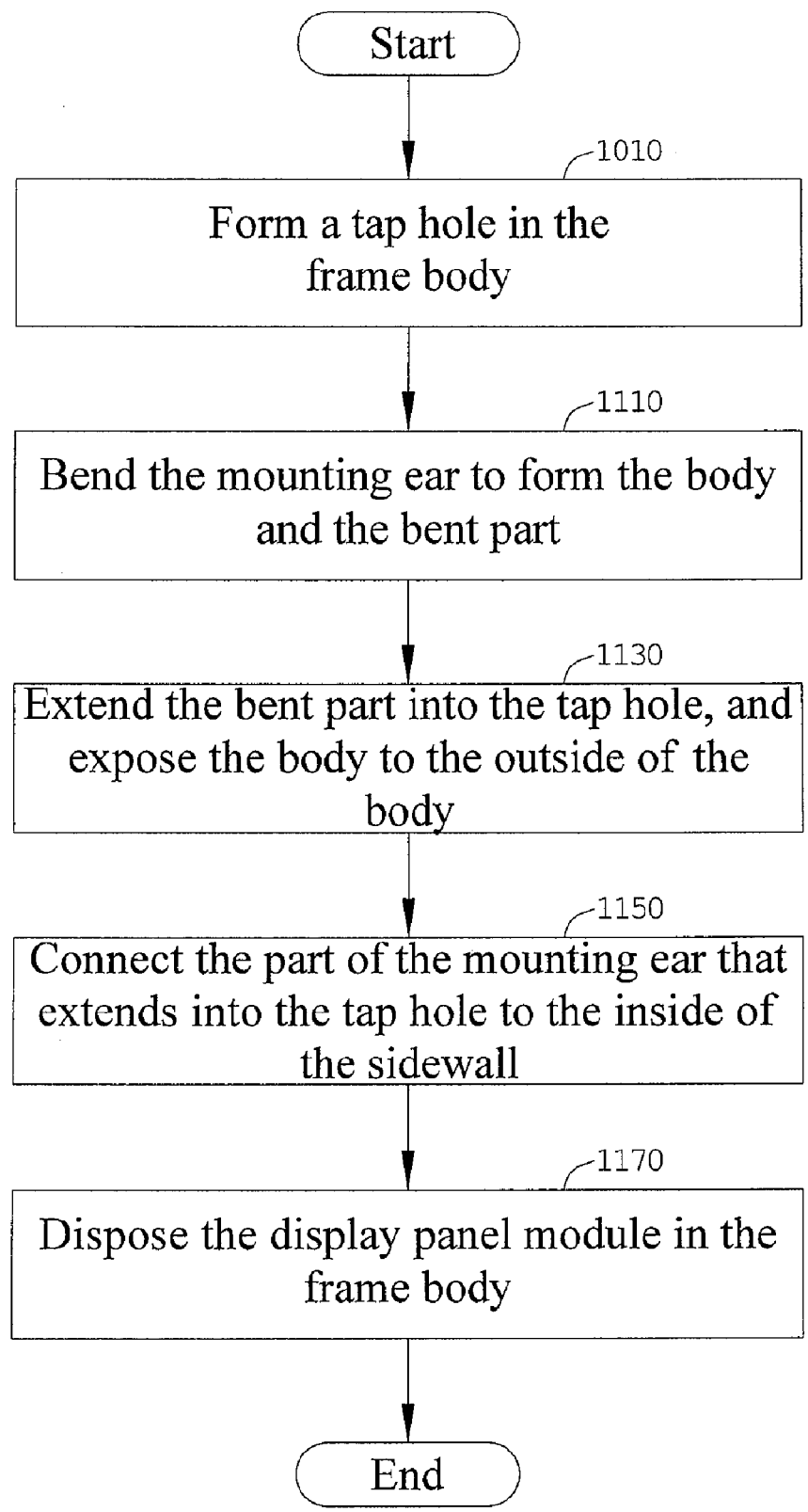
FIG. 10 is the flow chart of another embodiment of the manufacturing method of the display device.

In the embodiment illustrated by FIG. 10, step 1030 can be divided into step 1110 and step 1130. Step 1110 includes bending a mounting ear to form a body and a bent part; when the mounting ear is made of metal, the body and the bent part can be formed by directly bending the metal component. However, if the mounting ear is made of other materials, the bent part and the body can be formed by thermoplastic bending or direct forming. Furthermore, the body is preferably perpendicular to the bent part; but in different embodiments, the body and the bent part can be bent with other included angles to coordinate with the design of the system housing.

Step 1130 includes extending the bent part into the tap hole to expose the body to the outside of the frame body. Because the tap hole could be formed in different parts of the frame body, the bent part can be completely or partially extended into the tap hole; likewise, the body may also be completely or partially exposed to the outside of the frame body.

This invention has been described in accordance with the above embodiments. What needs to point out is that the disclosed embodiments do not intend to limit the scope of this invention. In contrast, the modifications of the spirit and the scope included in the claims and the disposition of the equivalents are all included in the scope of this invention.

What is claimed is:

1. An electronic device frame for use with a display housing, including: a frame body, having a top surface and a sidewall, the sidewall extending away from the top surface from an edge of the top surface, wherein the frame body is provided with a tap hole; and a mounting ear for mounting the frame body on the display housing, wherein a part of the mounting ear extends into the tap hole from outside of the frame body, and a surface of the part of the mounting ear is parallel and directly fixed to an inner surface of the sidewall; wherein the mounting ear includes: a body; and a bent part extending from the body and having an included angle with the body, wherein the bent part extends into the tap hole, and the surface of the part of the mounting ear is parallel and directly fixed to the inner surface of the sidewall; and wherein the other part of the mounting ear that is disposed on the outside of the frame body has a securing hole or is a connecting plate.

2. The electronic device frame of claim 1, wherein the part of the mounting ear that extends into the tap hole and the sidewall respectively have a corresponding positioning point.

3. The electronic device frame of claim 2, wherein the part of the mounting ear that extends into the tap hole is equal to or greater than 2 mm.

4. The electronic device frame of claim 1, wherein the part of the mounting ear that extends into the tap hole is covered by the sidewall.

5. The electronic device frame of claim 1, wherein the tap hole is positioned at the junction of the top surface and the sidewall, the part of the top surface near the sidewall or the part of the sidewall near the top surface.

6. The electronic device frame of claim 1, wherein the tap hole is positioned on one end of one side of the frame body near another side of the frame body or on a middle of the side of the frame body.

7. A display device comprising: a frame body, having a top surface and a sidewall, the sidewall extending away from the top surface from an edge of the top surface; wherein the frame body has a tap hole; a mounting ear for mounting the frame body on a display housing, wherein a part of the mounting ear extends into the tap hole from outside of the frame body, and a surface of the part of the mounting ear is parallel and directly fixed to an inner surface of the sidewall; and a display panel module disposed in the frame body, wherein a trough is formed on a side of the display panel module, and the trough corresponds to a part of the frame body where accommodates the part of the mounting ear which extends into the tap hole; wherein the mounting ear includes: a body; and a bent part extending from the body and being perpendicular to the body, wherein the bent part extends into the tap hole, and the surface of the part of the mounting ear is parallel and directly fixed to the inner surface of the sidewall and is accommodated in the trough on the side of the display panel module.

8. The display device of claim 7, wherein the other part of the mounting ear outside the frame body has a securing hole or is a connecting plate.

9. The display device of claim 7, wherein the mounting ear is located on an outside part of the frame body.

10. The display device of claim 7, wherein the part of the mounting ear that extends into the tap hole and the sidewall respectively have a corresponding positioning point.

11. The display device of claim 10, wherein the part of the mounting ear that extends into the tap hole is equal to or greater than 2 mm.

12. The display device of claim 7, wherein the part of the mounting ear that extends into the tap hole is covered by the sidewall.

13. The display device of claim 7, wherein the tap hole is formed on the junction of the top surface and the sidewall, the part of the top surface near the sidewall or the part of the sidewall near the top surface.

14. The display device of claim 7, wherein the tap hole is formed on one end of one side of the frame body or on a middle of the side of the frame body.

15. A manufacturing method of a display device comprising the following steps: forming a tap hole in a frame body, wherein the frame body has a top surface and a sidewall, and the sidewall extends away from the top surface from an edge of the top surface; extending a part of a mounting ear into the tap hole from outside of the frame body, wherein the mounting ear is provided for mounting the frame body on a display housing; paralleling and directly fixing a surface of the part of the mounting ear that extends into the tap hole with an inner surface of the sidewall; disposing a display panel module in the frame body; wherein the step of extending the part of the mounting ear into the tap hole includes: bending the mounting ear to form a body and a bent part; and extending the bent part into the tap hole and exposing the body outside the frame body; and wherein the step of disposing the display panel includes forming a trough on a side of the display panel module and the trough correspondingly accommodating the part of the mounting ear that extends into the tap hole.

16. The manufacturing method of claim 15, wherein the step of fixing the part of the mounting ear with the inner surface of the sidewall includes welding the bent part to the inner surface of the sidewall.

17. The manufacturing method of claim 15, wherein the step of fixing the part of the mounting ear with the inner surface of the sidewall further includes:
  forming corresponding positioning points respectively on the part of the mounting ear that extends into the tap hole and the sidewall; and
  aligning the corresponding positioning points.

18. The manufacturing method of claim 15 further comprising forming a securing hole in the body of the mounting ear outside the frame body.

* * * * *